(12) United States Patent
Taya

(10) Patent No.: US 10,937,708 B2
(45) Date of Patent: Mar. 2, 2021

(54) POWER MODULE AND METHOD OF MANUFACTURING THE SAME

(71) Applicant: Mitsubishi Electric Corporation, Chiyoda-ku (JP)

(72) Inventor: Masaki Taya, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/316,272

(22) PCT Filed: Jul. 28, 2017

(86) PCT No.: PCT/JP2017/027407
§ 371 (c)(1),
(2) Date: Jan. 8, 2019

(87) PCT Pub. No.: WO2018/042973
PCT Pub. Date: Mar. 8, 2018

(65) Prior Publication Data
US 2019/0214322 A1 Jul. 11, 2019

(30) Foreign Application Priority Data
Sep. 1, 2016 (JP) .............................. JP2016-170511

(51) Int. Cl.
*H01L 23/24* (2006.01)
*H01L 25/18* (2006.01)
(Continued)

(52) U.S. Cl.
CPC .............. *H01L 23/24* (2013.01); *H01L 23/28* (2013.01); *H01L 23/29* (2013.01); *H01L 23/291* (2013.01);
(Continued)

(58) Field of Classification Search
CPC ..... H01L 23/24; H01L 23/3735; H01L 23/48; H01L 23/31; H01L 23/29; H01L 23/28;
(Continued)

(56) References Cited

U.S. PATENT DOCUMENTS

2002/0070439 A1* 6/2002 Hiramatsu .............. H01L 23/24
257/687
2017/0032979 A1* 2/2017 Morita .................... H01L 24/97

FOREIGN PATENT DOCUMENTS

JP 10-173098 A 6/1998
JP 10270609 A * 10/1998
(Continued)

OTHER PUBLICATIONS

International Search Report dated Sep. 19, 2017 in PCT/JP2017/027407 filed on Jul. 28, 2017.
(Continued)

*Primary Examiner* — Ermias T Woldegeorgis
(74) *Attorney, Agent, or Firm* — Xsensus LLP

(57) ABSTRACT

A power module that can realize insulation performance by suppressing the occurrence of bubbles in silicone gel and the detachment between the silicone gel and an insulating substrate during high temperature, during low temperature and during low atmospheric pressure, to thereby suppress degradation of insulation performance. The power module includes: an insulating substrate having a front surface on which a power semiconductor element is mounted; a base plate joined to a back surface of the insulating substrate; a case fixed to the base plate and surrounding the insulating substrate; a cover fixed to the case and forming a sealed region; and a silicone gel serving as a filling member filling the entire sealed region and having internal stress maintained at compressive stress.

7 Claims, 3 Drawing Sheets

(51) Int. Cl.
| | |
|---|---|
| *H02M 1/00* | (2006.01) |
| *H01L 25/07* | (2006.01) |
| *H01L 23/31* | (2006.01) |
| *H01L 23/29* | (2006.01) |
| *H01L 23/28* | (2006.01) |
| *H01L 23/00* | (2006.01) |

(52) U.S. Cl.
CPC .......... *H01L 23/31* (2013.01); *H01L 23/3142* (2013.01); *H01L 24/73* (2013.01); *H01L 25/07* (2013.01); *H01L 25/18* (2013.01); *H02M 1/00* (2013.01); *H01L 2224/48137* (2013.01); *H01L 2224/48472* (2013.01); *H01L 2224/73265* (2013.01); *H01L 2924/19107* (2013.01)

(58) Field of Classification Search
CPC ... H01L 23/291; H01L 23/3142; H01L 25/18; H01L 25/07; H01L 24/73; H01L 2224/48472; H01L 2224/48137; H01L 2224/73265; H02M 1/00
See application file for complete search history.

(56) References Cited

FOREIGN PATENT DOCUMENTS

| | | |
|---|---|---|
| JP | 2002-184941 A | 6/2002 |
| JP | 2017/027407 | 7/2017 |
| WO | WO-2015098829 A1 * | 7/2015 ........... H01L 21/561 |

OTHER PUBLICATIONS

Japanese Office Action dated Apr. 14. 2020 in Japanese Patent Application No. 2018-537041 (with unedited computer generated English transtation), 10 pages.

* cited by examiner

POWER MODULE AND METHOD OF MANUFACTURING THE SAME

TECHNICAL FIELD

The present invention relates to a sealing structure for a power module, in which a power semiconductor element is sealed with silicone gel, resin or the like, and a method of manufacturing the power module.

BACKGROUND ART

A semiconductor element of a type having a conductive path provided in the longitudinal direction of the element in order to cope with high voltage or a large amount of current is generally referred to as a power semiconductor element (for example, an IGBT (Insulated Gate Bipolar Transistor), a MOSFET (Metal Oxide Semiconductor Field Effect Transistor), a bipolar transistor, a diode or the like). A power module having a power semiconductor element mounted on a circuit board and packaged by a sealing member has been used in a wide range of fields such as industrial equipment, vehicles and railways. As an apparatus equipped with a power module attains improved performance in recent years, the power module has been required to attain improved performance, such as increased rated voltage and rated current, and an increased operating temperature range (higher and lower temperatures).

A structure called a case structure is mainly used for the package structure of a power module. A power module of a case type called the case structure has such a structure that a power semiconductor element is mounted on a heat dissipating base plate with an insulating substrate interposed therebetween and a case is bonded to the base plate. The semiconductor element mounted inside the power module is connected to a main electrode. A bonding wire is used for the connection between the power semiconductor element and the main electrode. Generally, as a sealing member for the power module, an insulating gel-like filler, typically silicone gel, is used in order to prevent an insulation failure during the application of high voltage.

Generally, the amount of gas that can be dissolved in silicone gel decreases as the temperature increases. Therefore, as the operating temperature range of a power module increases and silicone gel is used at a higher temperature, an excess of gas, which cannot be dissolved in the silicone gel, forms bubbles. At a location of the occurrence of such bubbles, the silicone gel and an insulating substrate (wiring pattern) are detached from each other, thus failing to obtain the effect of insulation sealing by the silicone gel. Accordingly, the insulation performance of the power module is degraded.

In order to suppress the occurrence of bubbles in the silicone gel as well as the detachment, the internal stress of the silicone gel should be compressive stress. This is because when the internal stress is tensile stress, the tensile stress acts to increase and promote the bubbles and the detachment.

A power module has been disclosed which is configured to seal gas in a pressurized state in a space above silicone gel filling a case, to thereby pressurize the silicone gel, in order to suppress the occurrence of bubbles in the silicone gel as well as the detachment (for example, PTL 1).

CITATION LIST

Patent Literature

PTL 1: Japanese Patent Laying-Open No. 2013-149819 (p. 7, FIG. 2)

SUMMARY OF INVENTION

Technical Problem

In the power module described in PTL 1, however, since the gas in the space above the silicone gel filling the case is sealed in a pressurized state, once the sealing of the case is degraded, the pressure of the sealed gas is reduced and the pressure applied to the silicone gel is reduced, resulting in degraded insulation performance. Moreover, a pressurizing and sealing structure is required, resulting in increased size of the module and degraded productivity.

The present invention has been made to solve the aforementioned problems, and obtains a power module capable of ensuring insulation performance by suppressing the occurrence of bubbles and the detachment between silicone gel and an insulating substrate.

Solution to Problem

A power module according to the present invention includes: an insulating substrate having a front surface on which a power semiconductor element is mounted; a base plate joined to a back surface of the insulating substrate; a case fixed to the base plate and surrounding the insulating substrate; a cover fixed to the case and forming a sealed region; and a filling member filling the sealed region and having internal stress maintained at compressive stress.

Advantageous Effects of Invention

According to the present invention, the occurrence of bubbles in silicone gel and the detachment between the silicone gel and an insulating substrate can be suppressed, so that a power module of highly reliable insulation performance can be obtained.

DESCRIPTION OF EMBODIMENTS

First Embodiment

Figure 1:
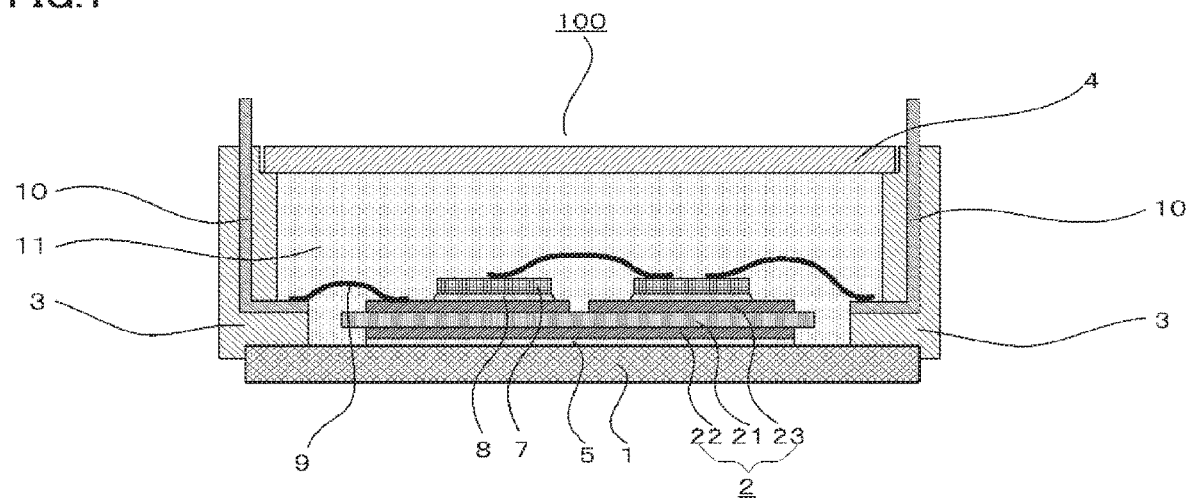
FIG. 1 is a schematic diagram of cross-sectional structure showing a power module according to a first embodiment.

FIG. 1 is a schematic diagram of cross-sectional structure showing a power module 100 according to a first embodiment of the present invention. In FIG. 1, power module 100 includes a base plate 1, an insulating substrate 2, a power semiconductor element 7 serving as a semiconductor element, a bonding wire 9, a terminal 10, a case 3 serving as a case member, a cover 4 serving as a cover member, a silicone gel 11 serving as a filling member, and solders 5, 8.

Insulating substrate 2 is joined onto base plate 1 using solder 8. Thus, base plate 1 is jointed to a back surface of insulating substrate 2. Insulating substrate 2 includes an insulating layer 21 and metal plates 22, 23. Insulating substrate 2 has such a structure that metal plates 22, 23 are adhered to both surfaces of insulating layer 21. Insulating layer 21 is made of: a ceramic such as aluminum oxide, aluminum nitride, silicon nitride; epoxy resin; or the like. Metal plates 22, 23 are made of copper, aluminum or the like. A wiring pattern is formed on metal plate 23 on the upper surface (front surface) side of insulating substrate 2. Power semiconductor element 7 is joined to this metal plate 23 on the upper surface (front surface) side with solder 8. Power semiconductor element 7 is mounted on the front surface of insulating substrate 2. Although the solder is used here as the joining material, the joining material is not limited to this. The joining may be performed using an electrically conductive joining material such as sintered silver, sintered copper, an electrically conductive adhesive, or a liquid phase diffusion joining technique.

For power semiconductor element 7, a power control semiconductor element, a free wheeling diode or the like is used. Examples of the power control semiconductor element include a MOSFET (Metal Oxide Semiconductor Field Effect Transistor) and an IGBT (Insulated Gate Bipolar Transistor). Power semiconductor element 7 and terminal 10 are electrically connected to each other via bonding wire 9. Bonding wire 9 has a wire diameter of 0.1 to 0.5 mm, and is a wire material made of an aluminum alloy or a copper alloy. Although bonding wire 9 is used in the first embodiment, a bonding ribbon may be used.

Terminal 10 is a plate-like electrode made of a copper alloy. Terminal 10 is insert-molded or outsert-molded into case 3, and is used for input/output of current and voltage with respect to the outside of power module 100. Case 3 is fixed to base plate 1 with an adhesive or screws, for example. Accordingly, case 3 surrounds insulating substrate 2 fixed to base plate 1. As a material for case 3, PPS (Poly Phenylene Sulfide) resin or PBT (Poly Butylene Terephtalate) resin is generally used.

In order to ensure the insulating property in power module 100, silicone gel 11 fills a region surrounded by case 3 and base plate 1. Silicone gel 11 fills the region up to a height at which power semiconductor element 7 and bonding wire 9 are sealed in silicone gel 11. Silicone gel 11 is a liquid of low viscosity before curing, and is turned into gel when cured. Silicone gel 11 is either of heat curing type or of room temperature curing type, and will be described as being of the heat curing type below. The heat curing type is normally of one-component type.

Cover 4 is fixed to case 3 with an adhesive or screws, for example. Accordingly, a sealed region is formed by base plate 1, case 3 and cover 4. Cover 4 is in close contact with the upper surface of silicone gel 11 serving as a filling member. More specifically, the entire sealed region formed by base plate 1, case 3 and cover 4 is filled with silicone gel 11 serving as a filling member.

Here, the internal stress of silicone gel 11 is maintained at compressive stress in the operating temperature range and the operating pressure range of power module 100. Examples of the operating temperature range include from −40° C. to 150° C., and from −55° C. to 175° C. in harsher applications. Examples of the operating pressure range include from 0.6 atmospheric pressure (high ground of 4,000 m) to 1 atmospheric pressure in terms of absolute pressure. Thus, the harshest conditions include −55° C. and 0.6 atmospheric pressure, and the internal stress of silicone gel 11 needs to be maintained at compressive stress even in this environment.

However, if the low temperature side of the operating temperature range is a higher temperature than this example, and the low pressure side of the operating pressure range is a higher pressure than this example, then the value of the compressive stress required of the internal stress of silicone gel 11 may be a lower value, without causing any problems. Stated another way, it is important that the value of the internal stress of silicone gel 11 be always maintained in a compressive stress state, and the stress value cannot be categorically converted into numerical form.

Whether the internal stress of silicone gel 11 is compressive stress or tensile stress depends on the external air pressure, the temperature of silicone gel 11, the volume of silicone gel 11, the surface area of silicone gel 11, the temperature of silicone gel 11 (temperature variation from the curing temperature of silicone gel 11), and the rate of volume expansion of silicone gel 11. Generally, when the height variation of silicone gel caused by temperature change is represented by $\Delta L$, the surface area of silicone gel is represented by $S$, the volume of silicone gel is represented by $V$, the rate of volume expansion of silicone gel is represented by $\beta$, and the temperature variation is represented by $\Delta T$, then a relation of $\Delta L = V \times \beta \times \Delta T \times 1/S$ holds. The value of the internal stress of silicone gel 11 cannot be converted into numerical form by this, either.

Figure 2:
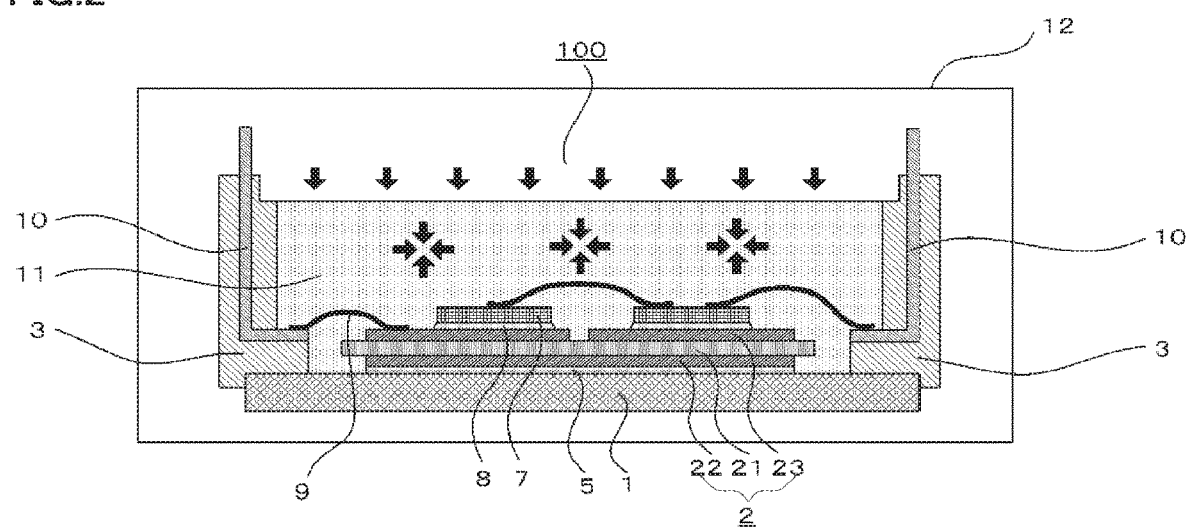
FIG. 2 is a schematic diagram of cross-sectional structure showing a step of manufacturing the power module according to the first embodiment.
Figure 3:
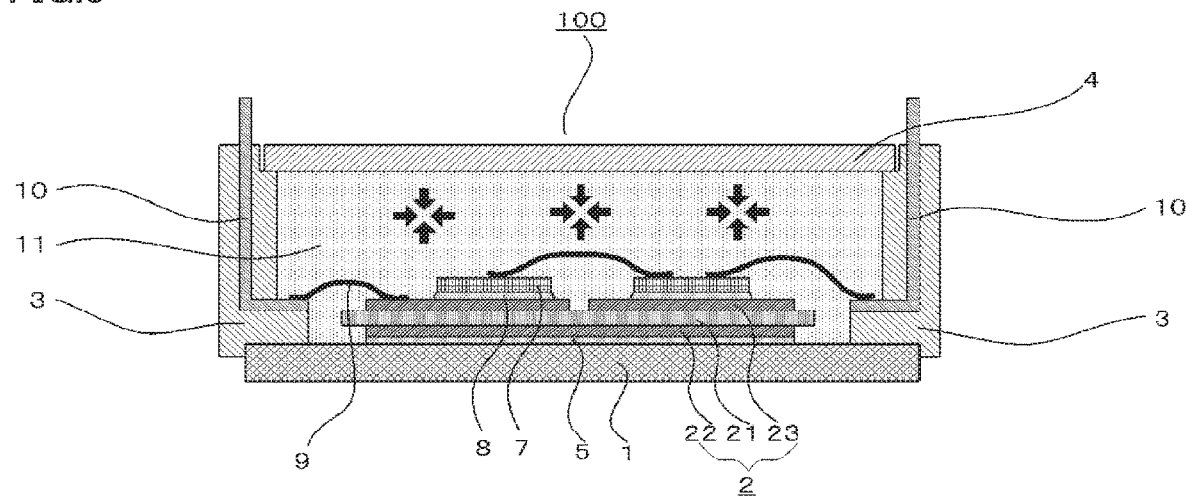
FIG. 3 is a schematic diagram of cross-sectional structure showing a step of manufacturing the power module according to the first embodiment.

FIGS. 2 and 3 are schematic diagrams of cross-sectional structure showing steps of manufacturing power module 100 according to the first embodiment. Power module 100 can be manufactured through the following procedure. In the figures, thick down arrows above silicone gel 11 indicate that a pressure is being applied and pressurization is being carried out. Four thick up, down, right and left arrows facing one another indicate that the internal stress of silicone gel 11 is in a state of compressive stress.

First, base plate 1 and insulating substrate 2 are joined to each other with solder 5. Then, metal plate 23 on the upper surface (front surface) side of insulating substrate 2 and power semiconductor element 7 are joined to each other with solder 8. On this occasion, the joining with solder 5 and the joining with solder 8 may be performed simultaneously. As a result of this step, power semiconductor element 7 is mounted on the front surface of insulating substrate 2, and base plate 1 is joined to the back surface of insulating substrate 2.

Then, case 3 and insulating substrate 2 are fixed to each other with an adhesive, screws or the like. As a result of this step, case 3 is fixed to base plate 1, and case 3 surrounds insulating substrate 2.

Then, terminal 10 and power semiconductor element 7 are connected to each other by bonding wire 9. Power semiconductor element 7 and power semiconductor element 7 are also connected to each other by bonding wire 9. Here, the step of fixing case 3 and insulating substrate 2 to each other may be performed after the connecting step with bonding wire 9.

Then, within a pressure vessel 12, silicone gel 11 serving as a filling member is injected into the region surrounded by case 3 and base plate 1. Silicone gel 11 before curing is a liquid material of low viscosity.

In the step of injecting silicone gel 11, the interior of pressure vessel 12 is maintained, by being pressurized, under a pressure higher than atmospheric pressure. Specifically, the applied pressure in pressure vessel 12 is desirably 2 atmospheric pressure or more in terms of absolute pressure, although it depends on the operating temperature and the operating pressure of power module 100 as well. More specifically, the pressurized pressure is at least a pressure maintained at compressive stress in the operating temperature range and the operating pressure range of power module 100. The temperature in pressure vessel 12 is increased while the pressurization is carried out in pressure vessel 12, to thereby cure silicone gel 11 from liquid to gel.

There are many types of silicone gel 11. An example type of silicone gel 11 is cured in two hours at 60° C., or in one hour at 80° C. Without pressurization, the internal stress of silicone gel 11 reaches 0 Pa at this curing temperature, and the internal stress is in a state of tensile stress (positive) on the lower temperature side than the curing temperature, and is in a state of compressive stress (negative) on the higher temperature side than the curing temperature.

Under pressurization, in contrast, the internal stress of silicone gel 11 is compressive stress at the curing temperature. Since silicone gel 11 is cured while the internal stress of silicone gel 11 remains as compressive stress, the internal stress of silicone gel 11 is maintained at compressive stress even after the pressurization is removed.

Once the pressurization by pressure vessel 12 is removed, silicone gel 11 having internal stress in a state of compressive stress is gradually creep-deformed, resulting in relaxation of the compressive stress. For this reason, before the creep deformation occurs, cover 4 is brought into close contact with the upper surface of silicone gel 11, and cover 4 and case 3 are fixed to each other with an adhesive or screws, for example. In this step, a sealed region is formed by fixing cover 4 to case 3, and the entire sealed region is filled with silicone gel 11 serving as a filling member.

Here, the entire sealed region refers to substantially the entire sealed region, and includes a situation where part of the region is not filled with silicone gel 11 during the operation process. By bringing cover 4 into close contact with the upper surface of silicone gel 11 and fixing cover 4, the creep deformation of silicone gel 11 is suppressed, so that the relaxation of the compressive stress can be prevented. The internal stress of silicone gel 11 filling the sealed region is maintained in a compressed state.

When bringing cover 4 into close contact with the upper surface of silicone gel 11 and fixing cover 4 and case 3 to each other, the fixing is more desirably is performed while pressurization is carried out. Since silicone gel 11 is not gas, it is difficult to compress the volume of silicone gel 11 because an extremely high pressure is required. In contrast, by fixing cover 4 and case 3 to each other while carrying out pressurization, it is easy to fill the interior of power module 100 with elastic silicone gel 11. This is because, by fixing cover 4 and case 3 to each other while carrying out pressurization, the gas present in power module 100 can be allowed to escape to the outside, while the remaining gas is compressed to attain a high pressure state.

Although silicone gel 11 is injected under pressurization in the above description, silicone gel 11 may be injected under atmospheric pressure, and then the interior of pressure vessel 12 may be pressurized to heat and cure silicone gel 11. In this case, the step of injecting silicone gel 11 may be performed inside or outside pressure vessel 12.

In addition, after or during the injection of silicone gel 11, the pressure in pressure vessel 12 can be reduced to and maintained at a pressure lower than atmospheric pressure, to thereby reduce the gas dissolved in silicone gel 11 before curing. Subsequently, the pressure may be increased to a pressure higher than atmospheric pressure to heat and cure silicone gel 11, to thereby further improve the insulation performance of power module 100.

The dissolved gas can be sufficiently defoamed by, for example, vacuum-defoaming silicone gel 11 for about one hour at 100 Torr (absolute pressure) using a vacuum pump. Although the gas will be dissolved at an earlier stage when the pressure is subsequently returned back to atmospheric pressure, it takes time for the gas to be dissolved sufficiently in silicon gel 11. Thus, the defoaming by pressure reduction is effective.

When the upper limit operating temperature of power module 100 is higher, the amount of gas that can exist in silicone gel 11 decreases, so that bubbles are more likely to occur. When the lower limit operating temperature of power module 100 is lower, the compressive stress decreases and the tensile stress increases in the internal stress of silicone gel 11 due to thermal contraction of silicone gel 11. The compressive stress decreases and the tensile stress increases, too, when the operating pressure of power module 100 is lower, such as in a high ground environment.

Thus, the applied pressure when curing silicone gel 11 may be set such that the internal stress of silicone gel 11 is maintained at compressive stress in the operating temperature range and the operating pressure range of power module 100.

In power module 100, since the internal stress of silicone gel 11 is maintained at compressive stress in the operating temperature range and the operating pressure range of power module 100, the growth of bubbles and detachment due to stress change associated with the expansion and contraction of silicone gel 11 in temperature change and pressure change in power module 100 can be suppressed. As a result, the detachment between silicone gel 11 and insulating substrate 2 can be suppressed, so that the insulation reliability of power module 100 can be improved.

As described above, the insulating substrate having the front surface on which the power semiconductor element is mounted, the base plate joined to the back surface of the insulating substrate, the case fixed to the base plate and surrounding the insulating substrate, the cover fixed to the case and forming the sealed region, and the filling member filling the entire sealed region and having internal stress maintained at compressive stress are provided. Thus, a power module of highly reliable insulation performance can be obtained.

Moreover, since the filling member is silicone gel, a power module of highly reliable insulation performance can be obtained.

Moreover, the step of joining the power semiconductor element to the front surface of the insulating substrate, the step of joining the base plate to the back surface of the insulating substrate, the step of fixing the case surrounding the insulating substrate to the base plate, the step of filling the region surrounded by the case and the base plate with the filling member having internal stress maintained at compressive stress, and the step of fixing the cover to the case to form the sealed region are provided. Thus, a power module of highly reliable insulation performance can be obtained.

Second Embodiment

Figure 4:
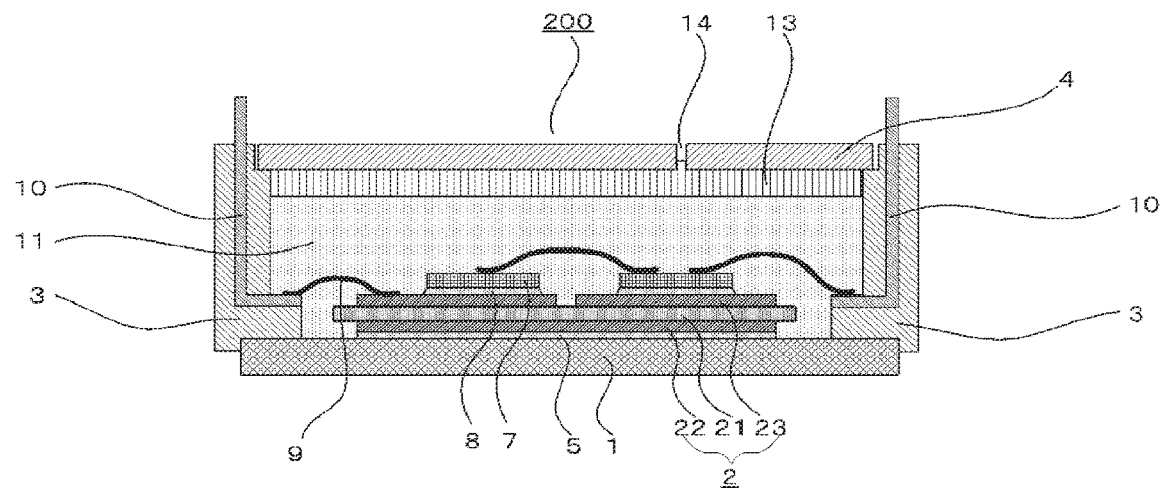
FIG. 4 is a schematic diagram of cross-sectional structure showing a power module according to a second embodiment.

FIG. 4 is a schematic diagram of cross-sectional structure showing a power module 200 according to a second embodiment of the present invention. In FIG. 4, power module 200 includes base plate 1, insulating substrate 2, power semiconductor element 7 serving as a semiconductor element, bonding wire 9, terminal 10, case 3 serving as a case member, cover 4 serving as a cover member, silicone gel 11 serving as a first filling member, solders 5, 8, an injection hole 14, and an expandable resin 13 serving as a second filling member.

Insulating substrate 2 is joined onto base plate 1 using solder 8. Thus, base plate 1 is jointed to the back surface of insulating substrate 2. Insulating substrate 2 includes insulating layer 21 and metal plates 22, 23. Insulating substrate 2 has such a structure that metal plates 22, 23 are adhered to both surfaces of insulating layer 21. Insulating layer 21 is made of: a ceramic such as aluminum oxide, aluminum nitride, silicon nitride; epoxy resin; or the like. Metal plates 22, 23 are made of copper, aluminum or the like. A wiring pattern is formed on metal plate 23 on the upper surface (front surface) side of insulating substrate 2. Power semiconductor element 7 is joined to this metal plate 23 on the upper surface (front surface) side with solder 8. Power semiconductor element 7 is mounted on the front surface of insulating substrate 2. Although solder 8 is used here as the joining material, the joining material is not limited to this. The joining may be performed using an electrically conductive joining material such as sintered silver, sintered copper, an electrically conductive adhesive, or a liquid phase diffusion joining technique.

For power semiconductor element 7, a power control semiconductor element, a free wheeling diode or the like is used. Examples of the power control semiconductor element include a MOSFET and an IGBT. Power semiconductor element 7 and terminal 10 are electrically connected to each other via bonding wire 9. Bonding wire 9 has a wire diameter of 0.1 to 0.5 mm, and is a wire material made of an aluminum alloy or a copper alloy. Although bonding wire 9 is used in the second embodiment, a bonding ribbon may be used.

Terminal 10 is a plate-like electrode made of a copper alloy. Terminal 10 is insert-molded or outsert-molded into case 3, and is used for input/output of current and voltage with respect to the outside of power module 200. Case 3 is fixed to base plate 1 with an adhesive or screws, for example. Accordingly, case 3 surrounds insulating substrate 2 fixed to base plate 1. As a material for case 3, PPS resin or PBT resin is generally used.

In order to ensure the insulating property in power module 200, silicone gel 11 fills a region covering power semiconductor element 7 of the region surrounded by case 3 and base plate 1. More specifically, silicone gel 11 fills the region at least up to a height at which power semiconductor element 7 and bonding wire 9 are sealed in silicone gel 11. Silicone gel 11 is a liquid of low viscosity before curing, and is turned into gel when cured. Silicone gel 11 is either of heat curing type or of room temperature curing type, and will be described as being of the heat curing type below. The heat curing type is normally of one-component type.

Cover 4 is fixed to case 3 with an adhesive or screws, for example. Accordingly, a sealed region is formed by base plate 1, case 3 and cover 4. Cover 4 is provided with injection hole 14, which will be closed later.

A region defined between cover 4 and the upper surface of silicone gel 11 is filled with expandable resin 13. Foamable urethane resin may be used as expandable resin 13. Foamable urethane resin, which has a foaming property, forms expandable resin 13 that does not shrink but instead expands in volume during curing. In contrast, normal epoxy resin shrinks in volume during curing (shrinkage on curing), and therefore, shrinkable resin is not suitable for use in the present invention.

If foamable urethane resin is used as expandable resin 13, for example, expandable resin 13 foams in a curing step to fill the gap, after expanding and foaming, to maintain a higher degree of hardness than cured silicone gel 11 (higher rigidity than the silicone gel). Among the foamable urethane resins, a resin called rigid foamed urethane, in particular, has rigidity and a foaming property. This resin is "rigid" because the foaming of this resin produces bubbles of independent type, unlike bubbles of open-cell type. Injection hole 14 provided in expandable resin cover 4 is sealed with expandable resin 13, causing base plate 1, case 3 and cover 4 to form a sealed region.

Silicone gel 11 serving as the first filling member is used for the region covering power semiconductor element 7 of the sealed region formed by base plate 1, case 3 and cover 4. The entire remaining sealed region in contact with cover 4 is filled with expandable resin 13 serving as the second filling member. Stated another way, the power semiconductor element 7 side is filled with silicone gel 11, and the cover 4 side is filled with expandable resin 13.

Here, the internal stress of silicone gel 11 is maintained at compressive stress in the operating temperature range and the operating pressure range of power module 200. Examples of the operating temperature range include from −40° C. to 150° C., and from −55° C. to 175° C. in harsher applications. Examples of the operating pressure range include from 0.6 atmospheric pressure (high ground of 4,000 m) to 1 atmospheric pressure in terms of absolute pressure. Thus, the harshest conditions include −55° C. and 0.6 atmospheric pressure, and the internal stress of silicone gel 11 needs to be maintained at compressive stress even in this environment.

However, if the low temperature side of the operating temperature range is a higher temperature than this example, and the low pressure side of the operating pressure range is a higher pressure than this example, then the value of the compressive stress required of the internal stress of silicone gel 11 may be a lower value, without causing any problems. Stated another way, it is important that the value of the internal stress of silicone gel 11 be always maintained in a compressive stress state, and the stress value cannot be categorically converted into numerical form.

Whether the internal stress of silicone gel 11 is compressive stress or tensile stress depends on the external air pressure, the temperature of silicone gel 11, the volume of silicone gel 11, the surface area of silicone gel 11, the temperature of silicone gel 11 (temperature variation from the curing temperature of silicone gel 11), and the rate of volume expansion of silicone gel 11. Generally, when the height variation of silicone gel 11 caused by temperature change is represented by ΔL, the surface area of silicone gel is represented by S, the volume of silicone gel is represented by V, the rate of volume expansion of silicone gel is represented by β, and the temperature variation is represented by ΔT, then a relation of ΔL=V×β×ΔT×1/S holds. The value of the internal stress of silicone gel 11 cannot be converted into numerical form by this, either.

Figure 5:
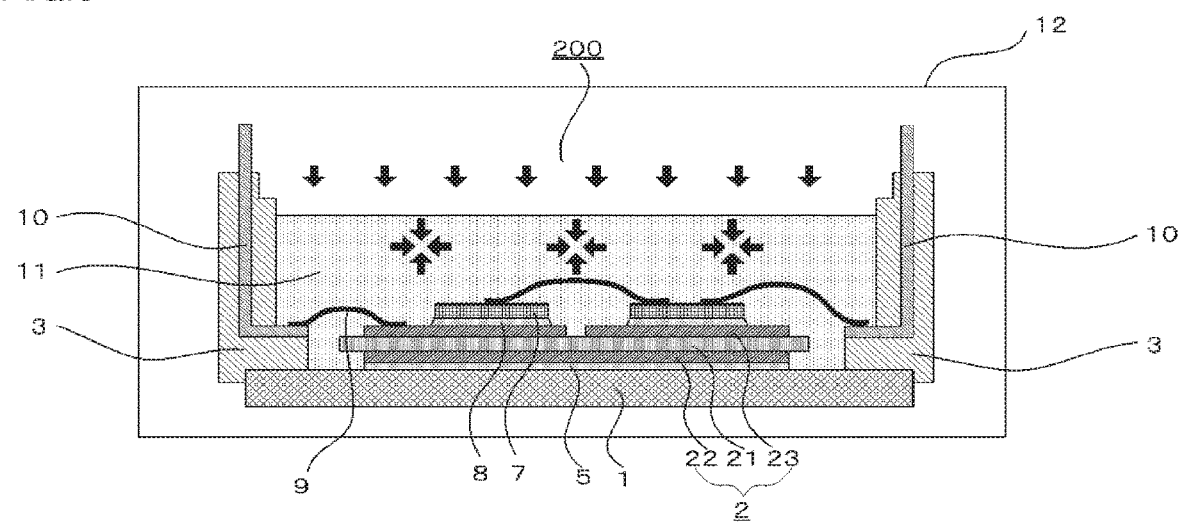
FIG. 5 is a schematic diagram of cross-sectional structure showing a step of manufacturing the power module according to the second embodiment.
Figure 6:
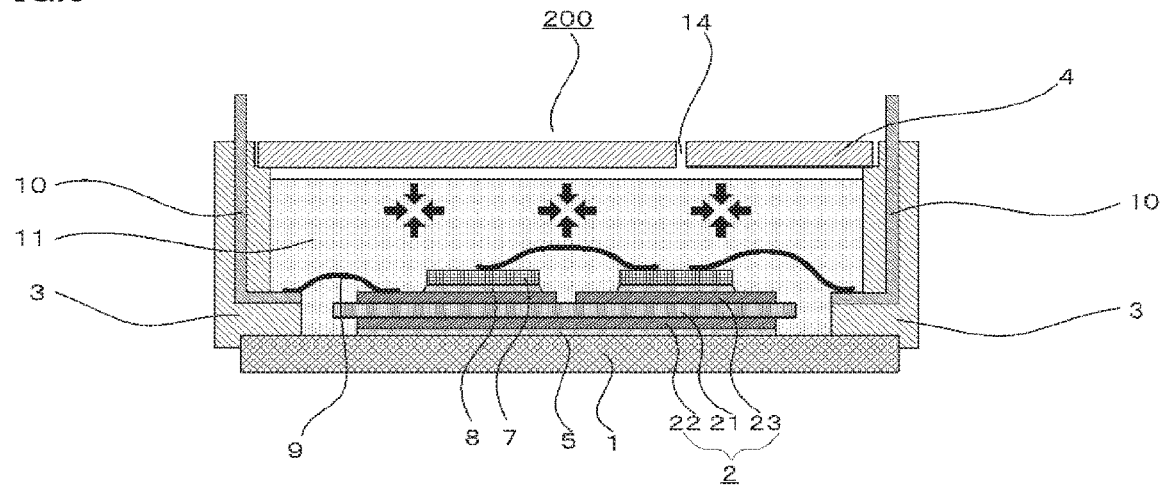
FIG. 6 is a schematic diagram of cross-sectional structure showing a step of manufacturing the power module according to the second embodiment.
Figure 7:
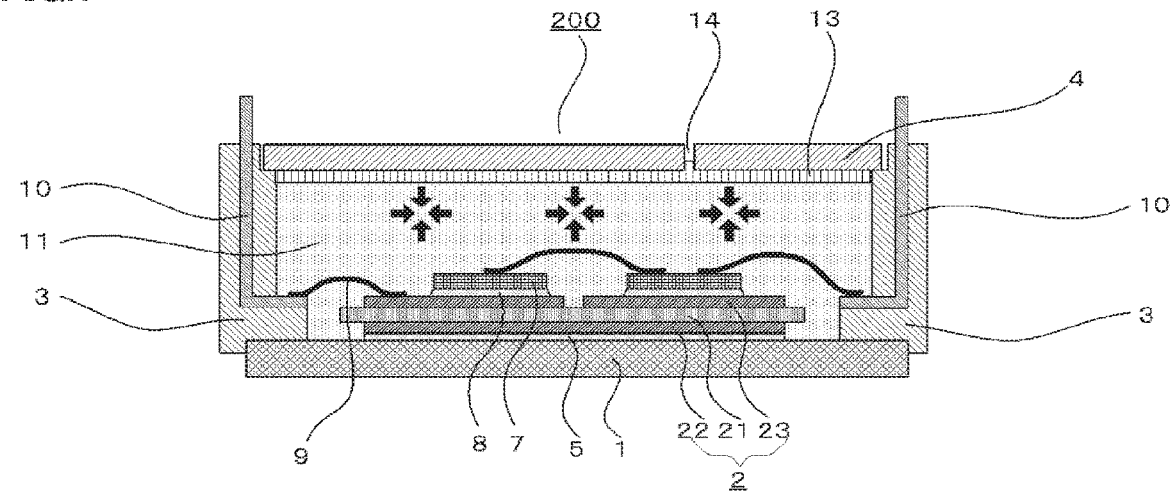
FIG. 7 is a schematic diagram of cross-sectional structure showing a step of manufacturing the power module according to the second embodiment.

FIGS. 5, 6 and 7 are schematic diagrams of cross-sectional structure showing steps of manufacturing power module 200 according to the second embodiment. Power module 200 can be manufactured through the following procedure. In the figures, thick down arrows above silicone gel 11 indicate that a pressure is being applied and pressurization is being carried out. Four thick up, down, right and left arrows facing one another indicate that the internal stress of silicone gel 11 is in a state of compressive stress.

First, base plate 1 and insulating substrate 2 are joined to each other with solder 5. Then, metal plate 23 on the upper surface (front surface) side of insulating substrate 2 and power semiconductor element 7 are joined to each other with solder 8. On this occasion, the joining with solder 5 and the joining with solder 8 may be performed simultaneously. As a result of this step, power semiconductor element 7 is mounted on the front surface of insulating substrate 2, and base plate 1 is joined to the back surface of insulating substrate 2.

Then, case 3 and insulating substrate 2 are fixed to each other with an adhesive, screws or the like. As a result of this step, case 3 is fixed to base plate 1, and case 3 surrounds insulating substrate 2.

Then, terminal 10 and power semiconductor element 7 are connected to each other by bonding wire 9. Power semiconductor element 7 and power semiconductor element 7 are also connected to each other by bonding wire 9. Here, the step of fixing case 3 and insulating substrate 2 to each other may be performed after the connecting step with bonding wire 9.

Then, within pressure vessel 12, silicone gel 11 serving as the first filling member is injected into the region surrounded by case 3 and base plate 1. Silicone gel 11 is injected at least until power semiconductor element 7, bonding wire 9 and the like are immersed in silicone gel 11. Silicone gel 11 before curing is a liquid material of low viscosity.

In the step of injecting silicone gel 11, the interior of pressure vessel 12 is maintained, by being pressurized, under a pressure higher than atmospheric pressure. Specifically, the applied pressure in pressure vessel 12 is desirably 2 atmospheric pressure or more in terms of absolute pressure, although it depends on the operating temperature and the operating pressure of power module 200 as well. More specifically, the pressurized pressure is at least a pressure maintained at compressive stress in the operating temperature range and the operating pressure range of power module 200. The temperature in pressure vessel 12 is increased while the pressurization is carried out in pressure vessel 12, to thereby cure silicone gel 11 from liquid to gel.

There are many types of silicone gel 11. An example type of silicone gel 11 is cured in two hours at 60° C., or in one hour at 80° C. Without pressurization, the internal stress of silicone gel 11 reaches 0 Pa at this curing temperature, and the internal stress is in a state of tensile stress (positive) on the lower temperature side than the curing temperature, and is in a state of compressive stress (negative) on the higher temperature side than the curing temperature.

Under pressurization, in contrast, the internal stress of silicone gel 11 is compressive stress at the curing temperature. Since silicone gel 11 is cured while the internal stress of silicone gel 11 remains as compressive stress, the internal stress of silicone gel 11 is maintained at compressive stress even after the pressurization is removed.

Then, cover 4 provided with injection hole 14 is fixed to case 3 with an adhesive, screws or the like. This is a step prior to the formation of the sealed region by base plate 1, case 3 and cover 4.

Then, expandable resin 13 serving as the second filling member is injected through injection hole 14 into power module 200, and is cured. On this occasion, expandable resin 13 expands by foaming to fill the region between cover 4 and the upper surface of silicone gel 11, and is cured. If foamable urethane resin, particularly rigid foamed urethane, is used as expandable resin 13, for example, expandable resin 13 foams in a curing step to fill the gap, after expanding and foaming, to maintain a higher degree of hardness than cured silicone gel 11 (higher rigidity than the silicone gel).

A plurality of injection holes 14 may be provided in cover 4. For example, injection holes 14 may be provided at two locations on the right and left ends of cover 4, with the left injection hole 14 positioned higher and the right injection hole 14 positioned lower, and expandable resin 13 may be injected through the right injection hole 14, to fill the region between cover 4 and the upper surface of silicone gel 11 with expandable resin 13 while allowing the gas to escape through the left injection hole 14.

Once the pressurization by pressure vessel 12 is removed, silicone gel 11 having internal stress in a state of compressive stress is gradually creep-deformed, resulting in relaxation of the compressive stress. For this reason, before the creep deformation occurs, the gap between the upper surface of silicone gel 11 and cover 4 is filled with expandable resin 13. The filling by expandable resin 13 can suppress the creep deformation of silicone gel 11, so that the relaxation of the compressive stress can be prevented.

Although silicone gel 11 is injected under pressurization in the above description, silicone gel 11 may be injected under atmospheric pressure, and then the interior of pressure vessel 12 may be pressurized to heat and cure silicone gel 11. In this case, the step of injecting silicone gel 11 may be performed inside or outside pressure vessel 12.

In addition, after or during the injection of silicone gel 11, the pressure in pressure vessel 12 can be reduced to and maintained at a pressure lower than atmospheric pressure, to thereby reduce the gas dissolved in silicone gel 11 before curing. Subsequently, the pressure may be increased to a pressure higher than atmospheric pressure to heat and cure silicone gel 11, to thereby further improve the insulation performance of power module 200.

The dissolved gas can be sufficiently defoamed by, for example, vacuum-defoaming silicone gel 11 for about one hour at 100 Torr (absolute pressure) using a vacuum pump. Although the gas will be dissolved at an earlier stage when the pressure is subsequently returned back to atmospheric pressure, it takes time for the gas to be dissolved sufficiently in silicon gel 11. Thus, the defoaming by pressure reduction is effective.

In addition, after the step of fixing cover 4 to case 3, silicone gel 11 may be injected through injection holes 14 and cured under pressurization, and then expandable resin 13 may be provided.

When the upper limit operating temperature of power module 200 is higher, the amount of gas that can exist in silicone gel 11 decreases, so that bubbles are more likely to occur. When the lower limit operating temperature of power module 200 is lower, the compressive stress decreases and the tensile stress increases in the internal stress of silicone gel 11 due to thermal contraction of silicone gel 11. The compressive stress decreases and the tensile stress increases, too, when the operating pressure of power module 200 is lower, such as in a high ground environment.

Thus, the applied pressure when curing silicone gel 11 may be set such that the internal stress of silicone gel 11 is maintained at compressive stress in the operating temperature range and the operating pressure range of power module 200.

In power module 200, since the internal stress of silicone gel 11 is maintained at compressive stress in the operating temperature range and the operating pressure range of power module 200, the growth of bubbles and detachment due to stress change associated with the expansion and contraction of silicone gel 11 in temperature change and pressure change in power module 200 can be suppressed. As a result, the detachment between silicone gel 11 and insulating substrate 2 can be suppressed, so that the insulation reliability of power module 200 can be improved.

As described above, the insulating substrate having the front surface on which the power semiconductor element is mounted, the base plate joined to the back surface of the insulating substrate, the case fixed to the base plate and surrounding the insulating substrate, the cover fixed to the case and forming the sealed region, and the filling member filling the entire sealed region and having internal stress maintained at compressive stress are provided. Thus, a power module of highly reliable insulation performance can be obtained.

Moreover, the filling member has the first filling member and the second filling member, the first filling member being silicone gel and filling the region covering the power semiconductor element of the sealed region, and the second filling member filling the entire remaining sealed region in contact with the cover. Thus, a power module of highly reliable insulation performance can be obtained.

Moreover, since the second filling member is expandable resin, a power module of highly reliable insulation performance can be obtained.

Moreover, since the expandable resin is foamable urethane resin, a power module of highly reliable insulation performance can be obtained.

Moreover, the step of joining the power semiconductor element to the front surface of the insulating substrate, the step of joining the base plate to the back surface of the insulating substrate, the step of fixing the case surrounding the insulating substrate to the base plate, the step of filling the region surrounded by the case and the base plate with the filling member having internal stress maintained at compressive stress, and the step of fixing the cover to the case to form the sealed region are provided. Thus, a power module of highly reliable insulation performance can be manufactured.

Third Embodiment

Figure 8:
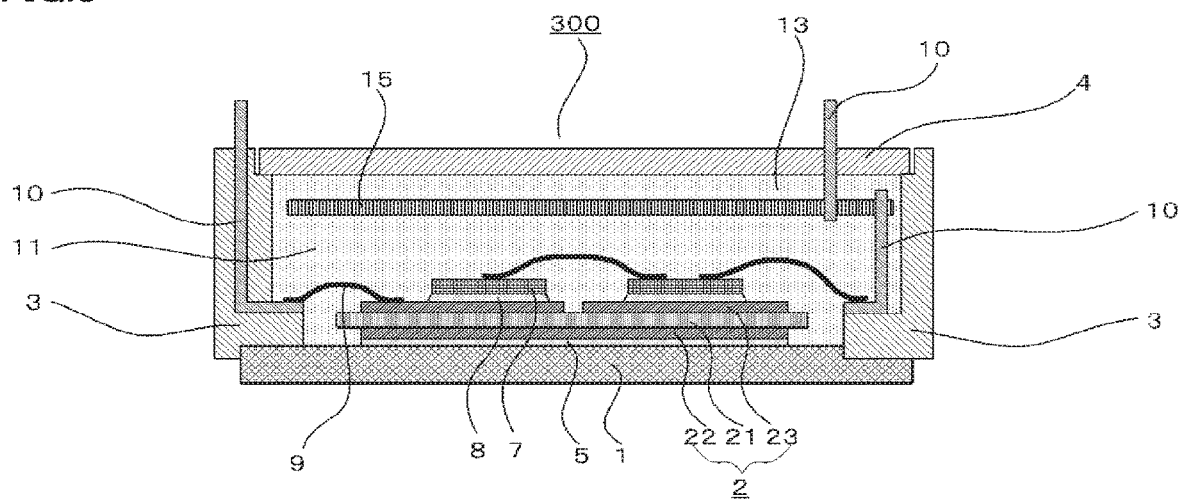
FIG. 8 is a schematic diagram of cross-sectional structure showing a power module according to a third embodiment.

FIG. 8 is a schematic diagram of cross-sectional structure showing a power module 300 according to a third embodiment of the present invention. In FIG. 8, power module 300 includes base plate 1, insulating substrate 2, power semiconductor element 7 serving as a semiconductor element, bonding wire 9, terminal 10, case 3 serving as a case member, cover 4 serving as a cover member, silicone gel 11 serving as a filling member, solders 5, 8, and a printed circuit board 15.

The third embodiment is different from the first embodiment in that it includes printed circuit board 15. Examples of a material for printed circuit board 15 include GFRP (glass epoxy resin). Throughout the specification and the drawings, the same symbols in the drawings indicate the same or corresponding elements. In addition, the forms of components represented throughout the specification are merely illustrative and are not limited to these descriptions.

A control circuit, a protection circuit and the like for power semiconductor element 7 are mounted on printed circuit board 15. Such power module 300 with the integrated control circuit and protection circuit is referred to as an IPM (Intelligent Power Module). Naturally, printed circuit board 15 is electrically connected to power semiconductor element 7. Printed circuit board 15 is disposed in the sealed region formed by base plate 1, case 3 and cover 4.

In power module 300 thus configured, since the internal stress of silicone gel 11 is maintained at compressive stress in the operating temperature range and the operating pressure range of power module 300, the growth of bubbles and detachment due to stress change associated with the expansion and contraction of silicone gel 11 in temperature change and pressure change in power module 300 can be suppressed. As a result, the detachment between silicone gel 11 and insulating substrate 2 can be suppressed, so that the insulation reliability of power module 300 can be improved.

Moreover, since the internal stress of silicone gel 11 is maintained at compressive stress in the operating temperature range and the operating pressure range of power module 300, and the interior of power module 300 is filled with silicone gel 11, silicone gel 11 cannot expand or contract due to temperature change and pressure change during the use of power module 300, so that the warpage or deformation of printed circuit board 15 is suppressed. The reliability of power module 300 is thereby improved.

As described above, the insulating substrate having the front surface on which the power semiconductor element is mounted, the base plate joined to the back surface of the insulating substrate, the case fixed to the base plate and surrounding the insulating substrate, the cover fixed to the case and forming the sealed region, the printed circuit board located in the sealed region and electrically connected to the power semiconductor element, and the filling member filling the entire sealed region and having internal stress maintained at compressive stress are provided. Thus, a power module of highly reliable insulation performance can be obtained.

Moreover, since the filling member is silicone gel, a power module of highly reliable insulation performance can be obtained.

Fourth Embodiment

Figure 9:
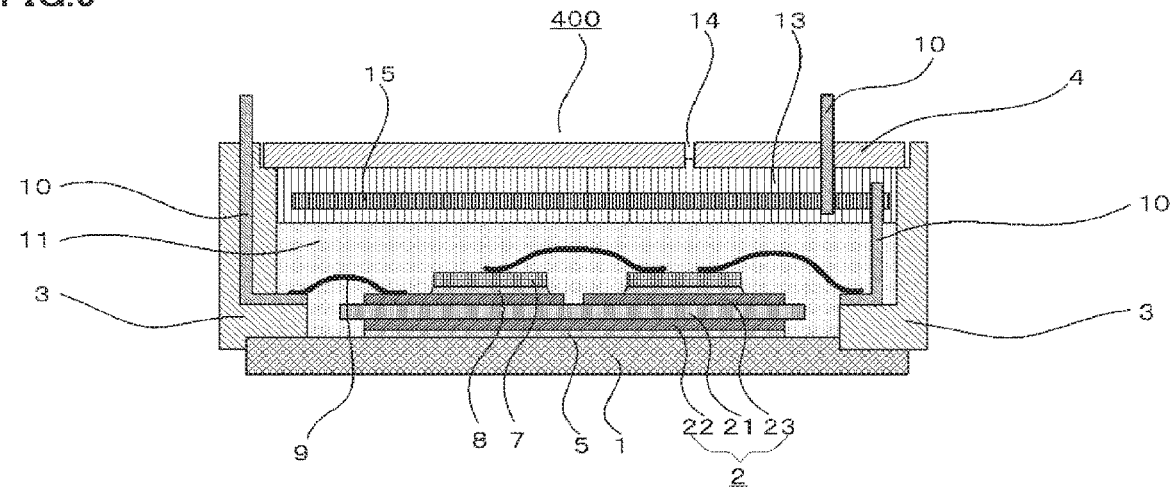
FIG. 9 is a schematic diagram of cross-sectional structure showing a power module according to a fourth embodiment.

FIG. 9 is a schematic diagram of cross-sectional structure showing a power module 400 according to a fourth embodiment of the present invention. In FIG. 9, power module 400 includes base plate 1, insulating substrate 2, power semiconductor element 7 serving as a semiconductor element, bonding wire 9, terminal 10, case 3 serving as a case member, cover 4 serving as a cover member, silicone gel 11 serving as a filling member, solders 5, 8, injection hole 14, expandable resin 13, and printed circuit board 15.

The fourth embodiment is different from the second embodiment in that it includes printed circuit board 15. Examples of a material for printed circuit board 15 include GFRP (glass epoxy resin).

A control circuit, a protection circuit and the like for power semiconductor element 7 are mounted on printed circuit board 15. Such power module 300 with the integrated control circuit and protection circuit is referred to as an IPM.

Naturally, printed circuit board 15 is electrically connected to power semiconductor element 7. Printed circuit board 15 is disposed in the sealed region formed by base plate 1, case 3 and cover 4.

In power module 400, since the internal stress of silicone gel 11 is maintained at compressive stress in the operating temperature range and the operating pressure range of power module 400, the growth of bubbles and detachment due to stress change associated with the expansion and contraction of silicone gel 11 in temperature change and pressure change in power module 400 can be suppressed. As a result, the detachment between silicone gel 11 and insulating substrate 2 can be suppressed, so that the insulation reliability of power module 400 can be improved.

Moreover, since the internal stress of silicone gel 11 is maintained at compressive stress in the operating temperature range and the operating pressure range of power module 400, and the interior of power module 400 is filled with silicone gel 11 and expandable resin 13, silicone gel 11 and expandable resin 13 cannot expand or contract due to temperature change and pressure change during the use of power module 400, so that the warpage or deformation of printed circuit board 15 is suppressed. The reliability of power module 400 is thereby improved.

As described above, the insulating substrate having the front surface on which the power semiconductor element is mounted, the base plate joined to the back surface of the insulating substrate, the case fixed to the base plate and surrounding the insulating substrate, the cover fixed to the case and forming the sealed region, the printed circuit board located in the sealed region and electrically connected to the power semiconductor element, and the filling member filling the entire sealed region and having internal stress maintained at compressive stress are provided. Thus, a power module of highly reliable insulation performance can be obtained.

Moreover, the filling member has the first filling member and the second filling member, the first filling member being silicone gel and filling the region covering the power semiconductor element of the sealed region, and the second filling member filling the entire remaining sealed region in contact with the cover. Thus, a power module of highly reliable insulation performance can be obtained.

Moreover, since the second filling member is expandable resin, a power module of highly reliable insulation performance can be obtained.

Moreover, since the expandable resin is foamable urethane resin, a power module of highly reliable insulation performance can be obtained.

Moreover, the step of joining the power semiconductor element to the front surface of the insulating substrate, the step of joining the base plate to the back surface of the insulating substrate, the step of fixing the case surrounding the insulating substrate to the base plate, the step of filling the region surrounded by the case and the base plate with the filling member having internal stress maintained at compressive stress, and the step of fixing the cover to the case to form the sealed region are provided. Thus, a power module of highly reliable insulation performance can be obtained.

Fifth Embodiment

A fifth embodiment is different from the first embodiment in that cover 4 and case 3 are fixed to each other under low temperature.

In the first embodiment, when bringing cover 4 into close contact with the upper surface of silicone gel 11 and fixing cover 4 and case 3 to each other, the fixing step is performed while pressurization is carried out. In the fifth embodiment, the step of fixing cover 4 and case 3 to each other is performed under low temperature.

Since silicone gel 11 is not gas, an extremely high pressure is required to compress the volume of silicone gel 11. In contrast, since rate of volume expansion $\beta$ of silicone gel 11 is much higher than the rates of volume expansion of the other members, silicone gel 11 shrinks significantly in volume under low temperature. Thus, cover 4 and case 3 can be readily fixed to each other without the need for an extremely high pressure. Accordingly, the interior of power module 100 can be readily filled with elastic silicone gel 11. When the temperature is returned back to normal temperature, silicone gel 11 is held down by cover 4 and thus cannot expand in volume, thereby having internal stress maintained at compressive stress.

In power module 100, since the internal stress of silicone gel 11 is maintained at compressive stress in the operating temperature range and the operating pressure range of power module 100, the growth of bubbles and detachment due to stress change associated with the expansion and contraction of silicone gel 11 in temperature change and pressure change in power module 100 can be suppressed. As a result, the detachment between silicone gel 11 and insulating substrate 2 can be suppressed, so that the insulation reliability of power module 100 can be improved.

As described above, the insulating substrate having the front surface on which the power semiconductor element is mounted, the base plate joined to the back surface of the insulating substrate, the case fixed to the base plate and surrounding the insulating substrate, the cover fixed to the case and forming the sealed region, and the filling member filling the entire sealed region and having internal stress maintained at compressive stress are provided. Thus, a power module of highly reliable insulation performance can be obtained.

Moreover, since the filling member is silicone gel, a power module of highly reliable insulation performance can be obtained.

Moreover, the step of joining the power semiconductor element to the front surface of the insulating substrate, the step of joining the base plate to the back surface of the insulating substrate, the step of fixing the case surrounding the insulating substrate to the base plate, the step of filling the region surrounded by the case and the base plate with the filling member having internal stress maintained at compressive stress, and the step of fixing the cover to the case to form the sealed region are provided. Thus, a power module of highly reliable insulation performance can be manufactured.

Moreover, since the cover and the case are fixed to each other under low temperature, a power module of highly reliable insulation performance can be manufactured.

It should be noted that the drawings are schematic and do not reflect the true sizes and the like of the illustrated components. Throughout the specification, the same symbols indicate the same or corresponding elements.

It should be understood that the embodiments described above are illustrative and non-restrictive in every respect. The scope of the present invention is defined by the terms of the claims, not by the description above, and is intended to include any modifications within the meaning and scope equivalent to the terms of the claims.

Moreover, the plurality of components disclosed in the above embodiments can be combined as appropriate to form an invention.

REFERENCE SIGNS LIST

1 base plate; 2 insulating substrate; 7 power semiconductor element; 9 bonding wire; 10 terminal; 3 case; 4 cover; 11 silicone gel; 5, 8 solder; 21 insulating layer; 22 metal plate; 23 metal plate; 12 pressure vessel; 13 expandable resin; 14 injection hole; 15 printed circuit board; 100, 200, 300, 400 power module.

The invention claimed is:

1. A method of manufacturing a power module within a pressure vessel, comprising the steps of:
    joining a power semiconductor element to a front surface of an insulating substrate;
    joining a base plate to a back surface of the insulating substrate;
    fixing a case surrounding the insulating substrate to the base plate;
    pressurizing an interior of the pressure vessel to a pressure higher than atmospheric pressure;
    filling a region surrounded by the case and the base plate with a filling member while the interior of the pressure vessel is pressurized to a pressure higher than atmospheric pressure, so that an internal stress of the filling member is maintained at a compressive stress during filling; and
    fixing a cover to the case to form a sealed region and to maintain the internal stress of the filling member at the compressive stress in an operating temperature range.

2. The method of manufacturing a power module according to claim 1, wherein the second filling member is expandable resin.

3. The method of manufacturing a power module according to claim 2, wherein the expandable resin is foamable urethane resin.

4. The method of manufacturing a power module according to claim 1, wherein the filling member is a first filling member,
    the method further comprising filling a region above the first filling member with a second filling member which is injected and cured after the first filling member is cured under pressurization.

5. The method of manufacturing a power module according to claim 1, wherein the internal stress of the filling member is the compressive stress in the operating temperature range each of before and after the cover is fixed to the case.

6. The method of manufacturing a power module according to claim 1, wherein the internal stress of the filling member is the compressive stress in the operating temperature range under a condition of −55° C. and 0.6 atmospheric pressure.

7. The method of manufacturing a power module according to claim 1, further comprising a printed circuit board located in the sealed region and electrically connected to the power semiconductor element.

* * * * *